United States Patent
Xie et al.

(10) Patent No.: US 12,556,145 B2
(45) Date of Patent: Feb. 17, 2026

(54) POWER AMPLIFICATION DEVICE, POWER AMPLIFICATION SYSTEM, AND OPERATION METHOD THEREOF

(71) Applicant: Bestechnic (Shanghai) Co., Ltd., Shanghai (CN)

(72) Inventors: Renzhong Xie, Shanghai (CN); Liang Xiong, Shanghai (CN); Lu Chai, Shanghai (CN)

(73) Assignee: BESTECHNIC (SHANGHAI) CO., LTD., Shanghai (CN)

( * ) Notice: Subject to any disclaimer, the term of this patent is extended or adjusted under 35 U.S.C. 154(b) by 585 days.

(21) Appl. No.: 17/993,164

(22) Filed: Nov. 23, 2022

(65) Prior Publication Data
US 2023/0283248 A1    Sep. 7, 2023

(30) Foreign Application Priority Data

Mar. 1, 2022   (CN) .......................... 202210193260.X

(51) Int. Cl.
*H03F 3/21*    (2006.01)
(52) U.S. Cl.
CPC ........ *H03F 3/211* (2013.01); *H03F 2200/366* (2013.01); *H03F 2200/451* (2013.01)
(58) Field of Classification Search
CPC ............... H03F 3/211; H03F 2200/366; H03F 2200/451

(Continued)

(56) References Cited

U.S. PATENT DOCUMENTS

| | | | |
|---|---|---|---|
| 8,140,606 B2 * | 3/2012 | Porco ........................ | H03F 3/68 708/530 |
| 2009/0096533 A1 * | 4/2009 | Paul .................... | H03F 3/45179 330/305 |

(Continued)

FOREIGN PATENT DOCUMENTS

CN    105978515 B  * 10/2018  ............. H03F 3/245

OTHER PUBLICATIONS

Farahabadi et al., "Compact High Power 60 GHz Power Amplifier in 65 nm CMOS", (c) 2103, IEEE conference. (Year: 2013).*

(Continued)

*Primary Examiner* — Hafizur Rahman
(74) *Attorney, Agent, or Firm* — Bayes PLLC

(57) ABSTRACT

In certain aspects, a power amplification device, a power amplification system, and an operation method thereof are disclosed. The power amplification system includes a power amplification device and a control unit. The power amplification device includes a plurality of power amplification circuits, a power supply network configured to supply a power source from a plurality of power sources to the plurality of power amplification circuits, and a transformer network configured to provide an output power that matches a transmit power level. The control unit includes a memory storing code and a processor coupled to the memory. When the code is executed, the processor is configured to determine a plurality of circuit configurations for the plurality of power amplification circuits based on the transmit power level, and configure the plurality of power amplification circuits using the plurality of circuit configurations, respectively, so that the output power matches the transmit power level.

17 Claims, 7 Drawing Sheets

(58) Field of Classification Search
USPC .......................................................... 330/295
See application file for complete search history.

(56) References Cited

U.S. PATENT DOCUMENTS

| | | | | |
|---|---|---|---|---|
| 2014/0087673 | A1* | 3/2014 | Mostov ..................... | H03F 3/21 455/78 |
| 2014/0295781 | A1* | 10/2014 | Kawano .................. | H03F 3/245 455/127.2 |
| 2016/0156380 | A1* | 6/2016 | Rafi ......................... | H04B 1/18 455/73 |
| 2020/0244233 | A1* | 7/2020 | Tahara ..................... | H03F 3/21 |
| 2021/0336641 | A1* | 10/2021 | Yamaguchi .............. | H04B 1/44 |
| 2021/0351517 | A1* | 11/2021 | Mishra ................. | H04B 1/0458 |
| 2023/0258699 | A1* | 8/2023 | Bellaouar ............... | H03F 3/189 324/705 |

OTHER PUBLICATIONS

AN60-010 of Mini-Circuits, Biasing of constant current MMIC Amplifiers, Mini-Circuits (c) 2020 (Year: 2020).*

Ki-Yong-Son et al., "A 1.8-GHz CMOS Power Amplifier Using Stacked nMOS and pMOS Structures for High-Voltage Operation", IEEE Transactions on Microwave Theory and Techniques, vol. 57, No. 11, Nov. 2009, pp. 2652-2660 (Year: 2009).*

Jordan Yates, "What Are DC-Blocking Capacitors, and Why Are They Important?" (Year: 2023).*

* cited by examiner

POWER AMPLIFICATION DEVICE, POWER AMPLIFICATION SYSTEM, AND OPERATION METHOD THEREOF

CROSS-REFERENCE TO RELATED APPLICATIONS

This application claims the benefit of priority to Chinese Patent Application No. 202210193260.X, filed on Mar. 1, 2022, which is incorporated herein by reference in its entirety.

BACKGROUND

The present disclosure relates to power amplification in a portable wireless communication device.

As part of a radio frequency (RF) transmitting system, a radio frequency power amplifier (RFPA) in a portable wireless communication device (such as a wireless headphone) consumes a substantial portion of power of the entire RF transmitting system. The efficiency of the RFPA may play a substantial role in improving the efficiency of the RF transmitting system. The RFPA can be any analog power amplifier, such as a class-A power amplifier, a class-AB power amplifier, a class-B power amplifier, a class-C power amplifier, etc. Technical parameters of the RFPA include, for example, an output power, a peak efficiency when the RFPA is at its peak output power, a backoff efficiency (or referred to as fallback efficiency) when the output power of the RFPA is backed off by a certain number of decibels (dBs) (e.g., 6 dBs, 12 dBs, etc.), and linearity of the RFPA.

SUMMARY

According to one aspect of the present disclosure, a power amplification device is disclosed. The power amplification device may include a plurality of power amplification circuits configured to provide a plurality of amplified outputs based on a plurality of inputs, respectively. The power amplification device may include a power supply network coupled to the plurality of power amplification circuits and configured to supply at least one of a plurality of power sources to the plurality of power amplification circuits. The power amplification device may include a transformer network coupled to the plurality of power amplification circuits and configured to provide an output power that matches a transmit power level based on the plurality of amplified outputs.

According to another aspect of the present disclosure, a power amplification system is disclosed. The power amplification system includes a power amplification device and a control unit. The power amplification device includes a plurality of power amplification circuits configured to provide a plurality of amplified outputs based on a plurality of inputs, respectively. The power amplification device includes a power supply network coupled to the plurality of power amplification circuits and configured to supply at least one power source from a plurality of power sources to the plurality of power amplification circuits. The power amplification device includes a transformer network coupled to the plurality of power amplification circuits and configured to provide an output power that matches a transmit power level based on the plurality of amplified outputs. The control unit is coupled to the power amplification device, and includes a memory storing code and a processor coupled to the memory. When the code is executed, the processor is configured to determine a plurality of circuit configurations for the plurality of power amplification circuits based on the transmit power level, respectively. The processor is further configured to configure the plurality of power amplification circuits using the plurality of circuit configurations, respectively, so that the output power matches the transmit power level.

According to yet another aspect of the present disclosure, an operation method of a power amplification device is disclosed. A transmit power level is received. A plurality of circuit configurations are determined for a plurality of power amplification circuits in the power amplification device based on the transmit power level, respectively. The plurality of power amplification circuits are configured using the plurality of circuit configurations, respectively, so that an output power of the power amplification device matches the transmit power level.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
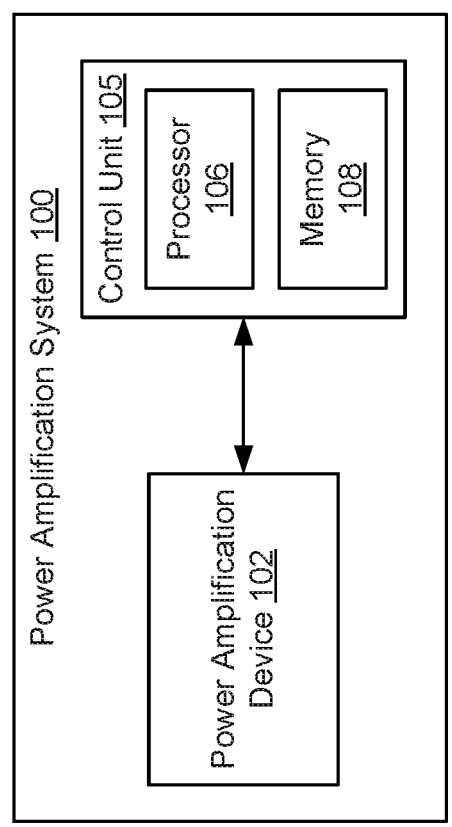
FIG. 1 illustrates a block diagram of an exemplary power amplification system, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Generally, a portable wireless communication device may implement different transmit power level controls in different communication scenarios so that the use time of the portable wireless communication device can be prolonged even if it has a limited power capacity (e.g., a limited battery capacity). However, an RFPA in an RF transmitting system can only maintain high efficiency when the RFPA is at its peak output power. The efficiency of the RFPA in the existing designs deteriorates sharply when the output power is backed off. Taking a class-B power amplifier as an example, when the output power of the class-B power amplifier is backed off by 6 dB, the backoff efficiency of the class-B power amplifier is only half of the peak efficiency.

In some examples, power supply modulation and/or Doherty load modulation can be used to improve the backoff efficiency. However, these two modulations may cause additional overhead in the chip area and may increase the chip cost. For example, a linear power modulator may be needed in the power supply modulation, and a high requirement on the tracking speed of the power modulator may be needed in broadband applications. In another example, the Doherty load modulation usually needs to integrate a quarter-wavelength transmission line or at least two transformers on-chip to achieve power synthesis and load conversion of a master power amplifier and a slave power amplifier. This integration of the quarter-wavelength transmission line or the at least two transformers on-chip consumes a large chip area and increases the product cost. Further, the master and slave power amplifiers are different types of power amplifiers with high mutual influence and high sensitivity between them. Besides, a circuit for the Doherty load modulation is a narrowband system due to the implementation of the load conversion and the quarter-wavelength transmission line, which may limit its use in broadband applications.

The RFPA typically employs multi-stage amplification to ensure linearity and a sufficient RF gain, with prior stages in the multi-stage amplification configured to provide a high gain, and the last stage (e.g., the power output stage) in the multi-stage amplification configured to provide a sufficient transmit power and a high transmit efficiency. In some examples, transistors of the power output stage may have a large size for providing sufficient transmit power. However, each unit size of transistors consumes a certain amount of quiescent current, and the large-size transistors may consume a large amount of quiescent current. In practical applications, the transmit power may be dynamically adjusted according to a distance between the portable wireless communication device (e.g., the wireless headphone) and a mobile phone. When the distance between the wireless headphone and the mobile phone is small, the RFPA does not need to provide as much output power as that when the distance is large, resulting in a current waste caused by the large-size transistors of the power output stage when the distance is small.

Consistent with the present disclosure, a power amplification device, a power amplification system, and an operation method thereof are disclosed herein for a portable wireless communication device to enhance the efficiency of the portable wireless communication device under different transmit power levels and therefore prolong a battery usage life of the portable wireless communication device. The power amplification device and system disclosed herein do not incur additional chip-area overhead and can be easily integrated on-chip without affecting an output bandwidth of the portable wireless communication device. The portable wireless communication device disclosed herein can be a wireless headphone or any other suitable wireless communication device.

For example, the power amplification device and system disclosed herein may adopt a current-type parallel power synthesis network based on analog power amplifiers. The power amplification device and system disclosed herein can achieve load matching at the peak output power and achieve impedance modulation when the output power is backed off by a first amount within a first range (e.g., a backoff by 6 dB) without additional overhead. For example, the power amplification device and system disclosed herein can adjust the number of power amplifiers to be turned on so that the output power can match a transmit power level. As a result, the backoff efficiency when the output power is backed off by the first amount within the first range (e.g., the 6-dB backoff efficiency) can be enhanced to be close to the peak power efficiency.

In another example, the power amplification device and system disclosed herein may adopt a power supply network with an on-chip power switching technology to further improve the efficiency with a high power backoff (e.g., a backoff being greater than 6 dB). Specifically, a plurality of power supply voltage modes can be seamlessly switched with each other in the power amplification device and system disclosed herein, so that the backoff efficiency can still be improved to be close to the peak power efficiency when the output power falls back by a second amount within a second range (e.g., a backoff by 12 dB).

In yet another example, a size of transistors in a power amplifier of the power amplification device and system disclosed herein can be dynamically adjusted to further improve the efficiency with the high power backoff. As described below in more detail, a total number of sub-power amplifiers to be turned on in each power amplifier of the power amplification device can be adjusted to further improve the efficiency when the output power falls back by a third amount within a third range (e.g., a backoff being greater than 12 dB).

FIG. 1 illustrates a block diagram of an exemplary power amplification system 100, according to some aspects of the present disclosure. Power amplification system 100 may include a power amplification device 102 and a control unit 105 that are coupled to each other. Control unit 105 may include a processor 106 and a memory 108. Power amplification device 102 and control unit 105 are described below in more detail with reference to FIGS. 2-7.

Processor 106 may include any appropriate type of microprocessor, central processing unit (CPU), graphics processing unit (GPU), digital signal processor, or microcontroller suitable for audio processing. Processor 106 may include one or more hardware units (e.g., portion(s) of an integrated circuit) designed for use with other components or to execute part of a program for controlling an operation of power amplification device 102. The program may be stored on a computer-readable medium, and when executed by processor 106, it may perform one or more functions disclosed herein. Processor 106 may be configured as a separate processor module dedicated to the controlling of power amplification device 102. Alternatively, processor 106 may be configured as a shared processor module for performing other functions unrelated to the controlling of power amplification device 102.

Processor 106 may be a complex instruction set computing (CISC) microprocessor, a reduced instruction set computing (RISC) microprocessor, a very long instruction word (VLIW) microprocessor, a processor executing any other type of instruction sets, or a processor that executes a combination of different instruction sets. In some implementations, processor 106 may be a special-purpose processor rather than a general-purpose processor. Processor 106 may include one or more special-purpose processing devices, such as application-specific integrated circuits (ASICs), field programmable gate arrays (FPGAs), digital signal processors (DSPs), systems on a chip (SoCs), and the like.

The present disclosure is not limited to any type of processor or processor circuit, as long as the processor or processor circuit can be configured for the controlling of power amplification device 102. Additionally, the term "processor" disclosed herein may include more than one processor, e.g., a processor with multiple cores or multiple processors, each of which has a multi-core design.

Memory 108 may include any appropriate type of mass storage provided to store any type of information that processor 106 may need to operate. For example, memory 108 may be a volatile or non-volatile, magnetic, semiconductor-based, tape-based, optical, removable, non-removable, or other types of storage device or tangible (i.e., non-transitory) computer-readable medium including, but not limited to, a Read-Only Memory (ROM), a flash memory, a dynamic Random Access Memory (RAM), and a static RAM. Memory 108 may be configured to store one or more computer programs that may be executed by processor 106 to perform functions disclosed herein. Memory 108 may be further configured to store information and data used by processor 106.

Figure 2:
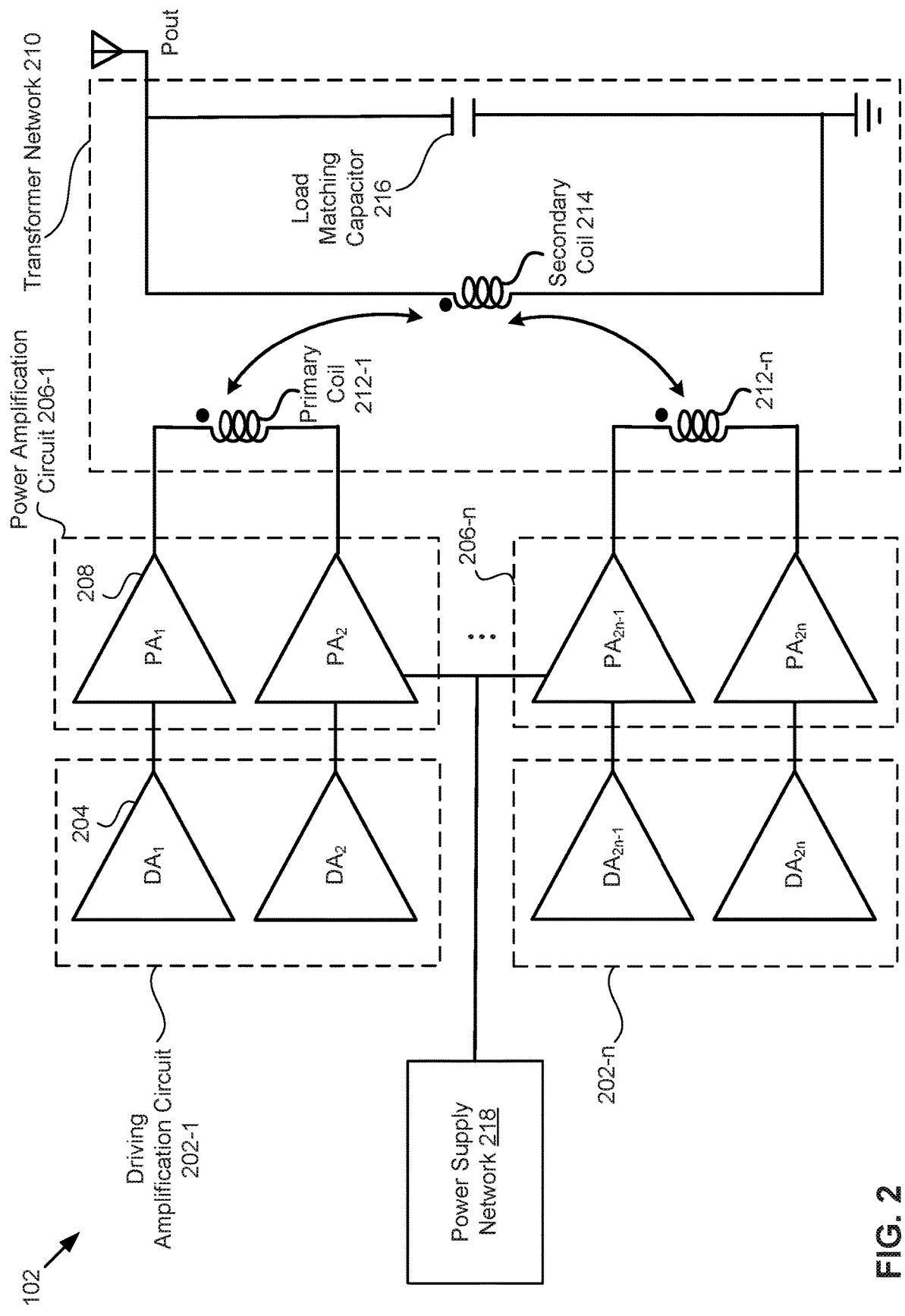
FIG. 2 illustrates a block diagram of an exemplary power amplification device, according to some aspects of the present disclosure.

FIG. 2 illustrates a block diagram of an exemplary power amplification device (e.g., power amplification device 102 of FIG. 1), according to some aspects of the present disclosure. Power amplification device 102 may include a plurality of driving amplification circuits 202-1, . . . , 202-n (also referred to as driving amplification circuit 202 individually or collectively), a plurality of power amplification circuits 206-1, . . . , 206-n (also referred to as power amplification circuit 206 individually or collectively), a power supply network 218, and a transformer network 210, where "n" represents a positive integer greater than 1 (e.g., n=2, 3, 4, etc.).

The plurality of driving amplification circuits 202 may be coupled to the plurality of power amplification circuits 206, respectively, and configured to provide a plurality of inputs to drive the plurality of power amplification circuits 206, respectively. The plurality of power amplification circuits 206 may be configured to provide a plurality of amplified outputs based on the plurality of inputs received from the plurality of driving amplification circuits 202, respectively.

In some implementations, each driving amplification circuit 202 may include at least two driving amplifiers 204 (DAs). Each power amplification circuit 206 may include at least two power amplifiers 208 (PAs) coupled to the at least two driving amplifiers 204, respectively. For example, driving amplification circuit 202-1 may include two driving amplifiers 204, which are denoted as $DA_1$ and $DA_2$, and power amplification circuit 206-1 may include two power amplifiers 208, which are denoted as $PA_1$ and $PA_2$. The driving amplifiers $DA_1$ and $DA_2$ are coupled to and configured to drive power amplifiers $PA_1$ and $PA_2$, respectively. Each power amplifier 208 may be an analog power amplifier, such as a current analog amplifier, or any other suitable type of power amplifiers. In some implementations, inputs to the two power amplifiers 208 of each power amplification circuit 206 can be differential input signals or inverting input signals.

Transformer network 210 may be coupled to the plurality of power amplification circuits 206 and configured to provide an output power that matches a transmit power level based on the plurality of amplified outputs received from the power amplification circuits 206. For example, transformer network 210 can be a parallel combining transformer. In some implementations, transformer network 210 may include: (a) a plurality of primary coils 212-1, . . . , 212-n (also referred to as primary coil 212 individually or collectively) coupled to the plurality of power amplification circuits 206, respectively; (b) a secondary coil 214 coupled to the plurality of primary coils 212 and configured to provide the output power through the coupling of the plurality of primary coils 212; and (c) a load matching capacitor 216 coupled to secondary coil 214.

Each power amplification circuit 206 may be coupled to a corresponding primary coil 212. For example, two output ports of two power amplifiers 208 in power amplification circuit 206 may be coupled to two ends of the corresponding primary coil 212 through coupling capacitors, respectively, to form a power amplification branch. For example, an output port of power amplifier $PA_1$ and an output port of power amplifier $PA_2$ are coupled to two ends of primary coil 212-1, respectively; and an output port of power amplifier $PA_{2n-1}$ and an output port of power amplifier $PA_{2n}$ are coupled to two ends of primary coil 212-n, respectively. The power amplification branch may be activated to provide an amplified output when at least one of the two power amplifiers 208 in power amplification circuit 206 is turned on. Exemplary coupling capacitors (e.g., CS1, CS2, CS3, CS4) are illustrated below with reference to FIG. 4. The coupling capacitors can simplify the structure of transformer network 210.

Secondary coil 214 can be coupled in parallel with the plurality of primary coils 212. A first end of secondary coil 214 may be coupled to a ground, and a second end of secondary coil 214 may be coupled to an output port (Pout) of power amplification device 102. Two ends of load matching capacitor 216 may be coupled to the first and second ends of secondary coil 214, respectively.

Power supply network 218 may be coupled to the plurality of power amplification circuits 206 and configured to supply at least one of a plurality of power sources to the plurality of power amplification circuits 206. For example, power supply network 218 may provide the same power source to the plurality of power amplification circuits 206. Alternatively, power supply network 218 may provide different power sources to different power amplification circuits 206. The plurality of power sources may include: (a) a first power source configured to provide a first operation voltage corresponding to a maximum (or peak) output power of power amplification device 102; and (b) one or more second power sources configured to provide one or more second operation voltages corresponding to one or more output powers smaller than the maximum output power.

Consistent with some aspects of the present disclosure, power amplification device 102 can be continuously turned on or intermittently turned on as needed. For example, power amplification device 102 can be turned on each time when a data frame is transmitted and turned off when the transmission of the data frame completes.

Consistent with some aspects of the present disclosure, control unit 105 may be configured to control an operation of power amplification device 102. Initially, control unit 105 may determine a transmit power level (e.g., an energy level of a transmit power) for power amplification device 102 by performing one or more operations described below. In some implementations, the transmit power level may be a discrete level. For example, a transmit power level of a 0-dB backoff (e.g., no power backoff) may correspond to a peak transmit power; a transmit power level of a 6-dB backoff may correspond to a transmit power which is ¼ of the peak transmit power; and a transmit power level of a 12-dB backoff may correspond to a transmit power which is 1/16 of the peak transmit power, etc. In some other implementations, the transmit power level can be a continuous level in a range of a 0-dB backoff to a 12-dB backoff.

It is contemplated that the transmit power (e.g., the output power) of power amplification device 102 can be adjusted dynamically to match one or more factors such as (a) a communication distance between a transmitter and a receiver, (b) a received signal strength indicator (RSSI) between the transmitter and the receiver, (c) a change on a communication service between the transmitter and the receiver, (d) a change on a data error rate between the transmitter and the receiver, etc. For example, the transmit power can be reduced when the communication distance decreases, when the RSSI increases, or when the data error rate decreases. In yet another example, the transmit power can be increased when the communication distance increases, when the RSSI decreases, or when the data error rate increases. In yet another example, the transmit power can be adjusted based on a need of the communication service since different communication services may require different transmit power levels. Therefore, control unit 105 may determine the transmit power level based on at least one of the communication distance, the RSSI, the service type, or the data error rate, etc., to avoid unnecessary energy consumption. In some implementations, control unit 105 may receive the transmit power level from an external module which is configured to determine the transmit power level based on one or more factors described above.

Next, control unit 105 may determine a plurality of circuit configurations for the plurality of power amplification circuits 206 based on the transmit power level, respectively. Control unit 105 may configure the plurality of power amplification circuits 206 using the plurality of circuit configurations, respectively, so that the output power Pout from transformer network 210 matches the transmit power level (e.g., the output power Pout can be equal to a transmit power determined by the transmit power level). Various exemplary circuit configurations for each power amplification circuit 206 are disclosed below. By configuring each power amplification circuit 206 using at least one of the plurality of circuit configurations disclosed herein, a wide range of output power adjustments can be achieved on power amplification device 102 without large efficiency loss when compared with the power supply modulation and/or Doherty load modulation mentioned above.

A first exemplary circuit configuration for power amplification circuit 206 (also referred to as a first operation mode of power amplification circuit 206) may include a configuration to adjust an operation voltage of each power amplifier 208 in power amplification circuit 206 (e.g., a configuration to select a power source from a plurality of power sources for power amplification circuit 206 based on the transmit power level). For example, control unit 105 may adjust the operation voltage of each power amplifier 208 by selecting or changing an operation voltage inputted to power amplifier 208. Power supply network 218 may provide a plurality of power sources with different operation voltages, and control unit 105 may select one of the power sources for each power amplifier 208 based on the transmit power level.

In some implementations, a first power source may provide a first operation voltage corresponding to a maximum power output of power amplifier 208 (or power amplification device 102). One or more second power sources may provide one or more second operation voltages corresponding to one or more reduced power outputs smaller than the maximum power output. In this case, multiple operation voltages may be provided to power amplifier 208 (or power amplification device 102) to achieve the peak power output and other reduced power outputs, respectively. Thus, the power outputs of power amplifier 208 (or power amplification device 102) can be selectable without large efficiency loss. In the present disclosure, the change in the power output of power amplifier 208 can be easily achieved with the first exemplary configuration disclosed herein without the above-mentioned issue associated with the power supply modulation. For example, when the operation voltage of power amplifier 208 is approximately reduced by half, the output voltage of power amplifier 208 can also be approximately reduced by half, so that the output current is reduced to avoid unnecessary efficiency loss.

A second exemplary circuit configuration for power amplification circuit 206 (also referred to as a second operation mode of power amplification circuit 206) may include a configuration to select one or more power amplifiers 208 to be turned on in power amplification circuit 206 (e.g., a configuration to adjust the total number of power amplifiers 208 to be turned on in power amplification circuit 206). In this case, the remaining power amplifiers 208 in power amplification circuit 206 may be turned off. In some implementations, control unit 105 may select one or more power amplifiers 208 to be turned on in each power amplification circuit 206 based on the transmit power level.

For example, control unit 105 may turn on both power amplifiers 208 (e.g., $PA_1$ and $PA_2$) of power amplifier circuit 206-1, which may result in an impedance for each power amplifier $PA_1$, $PA_2$ in the power amplification branch of power amplifier circuit 206-1 to be $Z/2$. Z may represent a differential load impedance transformed by an antenna impedance from transformer network 210 to the output of power amplification circuit 206-1. In another example, control unit 105 may turn on a first one of the two power amplifiers 208 and turn off a second one of the two power amplifier 208 (e.g., $PA_1$ being turned on, $PA_2$ being turned off). In this case, an output port of the turned-off power amplifier 208 (e.g., $PA_2$) can have a low-impedance state connected to the ground. An impedance for the turned-on power amplifier 208 (e.g., $PA_1$) in the power amplification branch of power amplifier circuit 206-1 can be Z.

As a result, by adjusting the number of power amplifiers 208 to be turned in each power amplification circuit 206, load impedance modulation can be easily implemented herein without causing the issue associated with the above-mentioned Doherty load modulation. For each power amplification branch formed by a corresponding power amplification circuit 206 disclosed herein, the driving capability of the corresponding power amplification circuit 206 is proportional to the number of power amplifiers 208 being turned on in the branch. The more power amplifiers 208 in the branch are turned on, the driving capability of the corresponding power amplification circuit 206 is stronger.

By adjusting the number of power amplifiers 208 to be turned on, power amplification device 102 can change the output power so that the amplification efficiency can be improved. Unlike the power supply modulation and Doherty load modulation mentioned above, which may incur additional chip-area overhead or require a large transistor size, power amplification device 102 disclosed herein does not require a power distribution circuit or a quarter-wavelength transmission line. Power amplification device 102 disclosed herein can be easily integrated and does not affect the output bandwidth. In addition, power amplifiers 208 of power amplification device 102 may be the same type of amplifiers, so that integration of power amplifiers 208 can be easy, and mutual influence between power amplifiers 208 of power amplification device 102 can be small.

In some implementations, control unit 105 may also adjust the number of driving amplifiers 204 to be turned on in each driving amplification circuit 202 based on the number of power amplifiers 208 to be turned on in a corresponding power amplification circuit 206. For example, with reference to FIG. 2, if power amplifier $PA_1$ and $PA_2$ in power amplification circuit 206-1 are turned on, then driving amplifiers $DA_1$ and $DA_2$ in driving amplification circuit 202-1 are also turned on to drive power amplifier $PA_1$ and $PA_2$, respectively. However, if only power amplifier $PA_1$ is turned on, then only driving amplifiers $DA_1$ is turned on. Driving amplifier $DA_2$ is turned off since power amplifier $PA_2$ is turned off. That is, when a particular power amplifier 208 is turned off, control unit 105 may also turn off a driving amplifier 204 that corresponds to the particular power amplifier 208 to save power consumption.

A third exemplary circuit configuration for power amplification circuit 206 (also referred to as a third operation mode of power amplification circuit 206) may include a configuration to select one or more power amplifiers 208 in each power amplification circuit 206 to be turned on and to select a power source for each power amplifier 208 being turned on. The third exemplary circuit configuration can be a combination of the first and second exemplary circuit configurations. Similar description will not be repeated herein.

Figure 3:
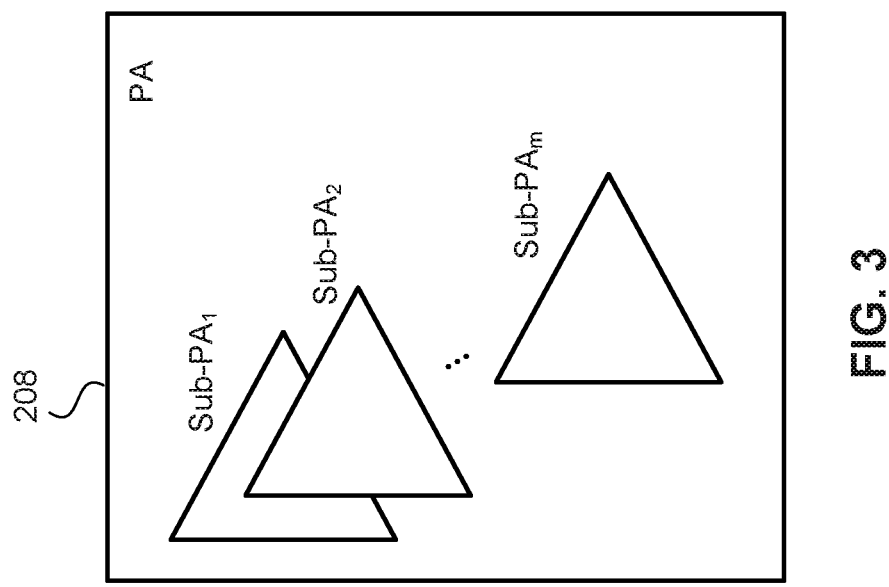
FIG. 3 illustrates a block diagram of an exemplary power amplifier in a power amplification circuit of a power amplification device, according to some aspects of the present disclosure.

In some implementations, each power amplifier 208 may include one or more sub-power amplifiers (sub-PAs). For example, each power amplifier 208 may include a plurality of sub-PAs that can be connected in series, in parallel, or in a combination of the series and parallel connections. FIG. 3 illustrates that power amplifier 208 may include multiple sub-PAs (e.g., sub-$PA_1$, sub-$PA_2$, . . . , sub-$PA_m$) whose outputs are connected in parallel, where m is a positive integer.

A fourth exemplary circuit configuration for power amplification circuit 206 (also referred to as a fourth operation mode of power amplification circuit 206) may include a configuration to select one or more sub-PAs to be turned on in each power amplifier 208. For example, control unit 105 may adjust the number of sub-PAs to be turned on in each power amplifier 208 based on the transmit power level. By adjusting the turning-on or turning-off of the sub-PAs, a finer control of the power output and power consumption can be achieved in power amplification device 102. An exemplary circuitry implementation of sub-PAs in power amplifier 208 is illustrated below in more detail with reference to FIG. 5.

In some implementations, control unit 105 may select one or more sub-PAs to be turned on in power amplifier 208 based on output characteristics of the plurality of sub-PAs to achieve the finer control of the power output and power consumption. In some implementations, the plurality of sub-PAs may have the same output characteristics so that uniform output control can be achieved. In some other implementations, at least some of the plurality of sub-PAs may have different output characteristics for non-uniform output control.

A fifth exemplary circuit configuration for power amplification circuit 206 (also referred to as a fifth operation mode of power amplification circuit 206) may include a configuration to select a power source from a plurality of power sources for each power amplifier 208 and to select one or more sub-PAs to be turned on in each power amplifier 208. The fifth exemplary circuit configuration can be a combination of the first and fourth exemplary circuit configurations. Similar description will not be repeated herein.

A sixth exemplary circuit configuration for power amplification circuit 206 (also referred to as a sixth operation mode of power amplification circuit 206) may include a configuration to (a) select one or more power amplifiers 208 in power amplification circuit 206 to be turned on and, (b) within each power amplifier 208 being turned on, select one or more sub-PAs to be turned on. The sixth exemplary circuit configuration can be a combination of the second and fourth exemplary circuit configurations. Similar description will not be repeated herein.

A seventh exemplary circuit configuration for power amplification circuit 206 (also referred to as a seventh operation mode of power amplification circuit 206) may include a configuration to (a) select one or more power amplifiers 208 in power amplification circuit 206 to be turned on, (b) select a power source from a plurality of power sources for each power amplifier 208 to be turned on, and, (c) within each power amplifier 208 being turned on, select one or more sub-PAs to be turned on. The seventh exemplary circuit configuration can be a combination of the first, second, and fourth exemplary circuit configurations. Similar description will not be repeated herein.

As a result, the various exemplary circuit configurations disclosed herein for each power amplification circuit 206 can include, for example: (a) adjusting an operation voltage of each power amplifier 208 in power amplification circuit 206 (e.g., selecting a power source from the plurality of power sources for each power amplifier 208); (b) adjusting the number of power amplifiers 208 to be turned on in power amplification circuit 206; (c) adjusting the number of sub-PAs to be turned on in each power amplifier 208; or (d) any combination of (a)-(c).

In some implementations, control unit 105 may determine a circuit configuration for power amplification circuit 206 based on the transmit power level and a predetermined priority strategy. The predetermined priority strategy may indicate any implementation order of the following three adjustments: (a) the adjustment of the operation voltage of each power amplifier 208 in power amplification circuit 206; (b) the adjustment of the number of power amplifiers 208 to be turned on in power amplification circuit 206; and (c) the adjustment of the number of sub-PAs to be turned on in each power amplifier 208.

A first example of the predetermined priority strategy may indicate (a) to adjust the number of power amplifiers 208 to be turned on in power amplification circuit 206 with a first priority and (b) to adjust the operation voltage of each power amplifier 208 with a second priority. The first priority is higher than the second priority. It is noted that power amplifier 208 can be more efficient with a high operation voltage. Thus, control unit 105 can firstly adjust the turning-on or turning-off of power amplifiers 208 to achieve the load impedance modulation with the high operation voltage, and then adjust the operation voltage of each power amplifier 208 to improve the efficiency further.

A second example of the predetermined priority strategy may indicate (a) to adjust the number of power amplifiers 208 to be turned on in power amplification circuit 206 with the first priority, (b) to adjust the operation voltage of each power amplifier 208 being turned on with the second priority, and (c) to adjust the number of sub-PAs to be turned on in each power amplifier 208 being turned on with a third priority. The second priority is higher than the third priority. It is noted that the turning-off of some of the sub-PAs in power amplifier 208 may cause the driving capability of power amplifier 208 to become weaker, which may result in efficiency reduction. Therefore, control unit 105 may firstly adjust the turning-on or turning-off of power amplifiers 208 in power amplification circuit 206 to achieve the load impedance modulation, and then adjust the operation voltage of each power amplifier 208 subsequently. After that, control unit 105 may further adjust the number of sub-PAs to be turned on in each power amplifier 208. As a result, the effect of efficiency improvement can be further enhanced.

A third example of the predetermined priority strategy may indicate (a) to adjust the number of power amplifiers 208 to be turned on in power amplification circuit 206 with the first priority, (b) to adjust the number of sub-PAs to be turned on in each power amplifier 208 with the second priority, and (c) to adjust the operation voltage of each power amplifier 208 with the third priority.

A fourth example of the predetermined priority strategy may indicate (a) to adjust the operation voltage of each power amplifier 208 with the first priority, (b) to adjust the number of power amplifiers 208 to be turned on in power amplification circuit 206 with the second priority, and (c) to adjust the number of sub-PAs to be turned on in each power amplifier 208 with the third priority.

A fifth example of the predetermined priority strategy may indicate (a) to adjust the operation voltage of each power amplifier 208 with the first priority, (b) to adjust the number of sub-PAs to be turned on in each power amplifier 208 with the second priority, and (c) to adjust the number of power amplifiers 208 to be turned on in power amplification circuit 206 with the third priority.

A sixth example of the predetermined priority strategy may indicate (a) to adjust the number of sub-PAs to be turned on in each power amplifier 208 with the first priority, (b) to adjust the operation voltage of each power amplifier 208 with the second priority, and (c) to adjust the number of power amplifiers 208 to be turned on in power amplification circuit 206 with the third priority.

A seventh example of the predetermined priority strategy may indicate (a) to adjust the number of sub-PAs to be turned on in each power amplifier 208 with the first priority, (b) to adjust the number of power amplifiers 208 to be turned on in power amplification circuit 206 with the second priority, and (c) to adjust the operation voltage of each power amplifier 208 with the third priority.

In some implementations, the transmit power level can be classified into a particular section from a plurality of predetermined sections. Each section may describe a range of the transmit power level. The same predetermined priority strategy or different predetermined priority strategies can be applied to different sections. No matter which section the transmit power level is classified into, control unit 105 can determine a circuit configuration for each power amplification circuit 206 of power amplification device 102 by performing the operations disclosed herein. The similar description will not be repeated herein.

FIG. 3 illustrates a block diagram of an exemplary power amplifier in a power amplification circuit, according to some aspects of the present disclosure. FIG. 3 is described above with reference to FIG. 2, and the similar description will not be repeated herein.

Figure 4:
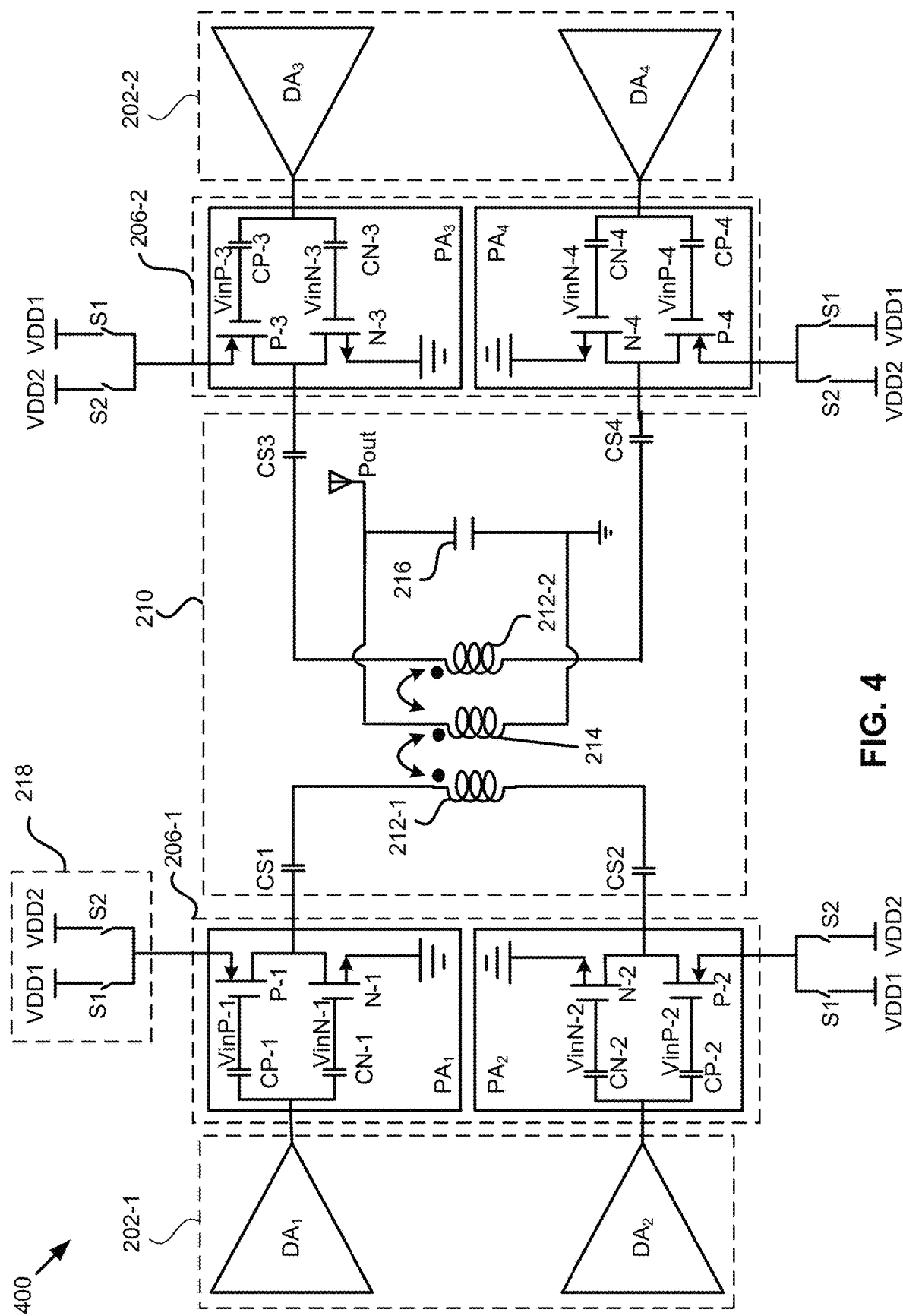
FIG. 4 illustrates an exemplary circuit implementation of a power amplification device, according to some aspects of the present disclosure.

FIG. 4 illustrates an exemplary circuit implementation of a power amplification device 400 (e.g., power amplification device 102), according to some aspects of the present disclosure. Power amplification device 400 may include two driving amplification circuits 202-1 and 202-2, two power amplification circuits 206-1 and 206-2, power supply network 218, and transformer network 210.

Driving amplification circuit 202-1 includes driving amplifiers $DA_1$ and $DA_2$, which may be coupled to power amplifiers $PA_1$ and $PA_2$ of power amplification circuit 206-1, respectively. Driving amplification circuit 202-2 includes driving amplifiers $DA_3$ and $DA_4$, which may be coupled to power amplifiers $PA_3$ and $PA_4$ of power amplification circuit 206-2, respectively. Power supply network 218 may be configured to provide one of two operation voltages VDD1 and VDD2 to each of power amplifiers $PA_1$, $PA_2$, $PA_3$, and $PA_4$.

Transformer network 210 includes two primary coils 212-1 and 212-2, a secondary coil 214, coupling capacitors CS1, CS2, CS3, and CS4, and load matching capacitor 216. Primary coils 212-1 and 212-2 may be coupled to power amplification circuits 206-1 and 206-2, respectively. For example, two ends of primary coil 212-1 are coupled to output ports of power amplifiers $PA_1$ and $PA_2$ of power amplification circuit 206-1 through coupling capacitors CS1 and CS2, respectively, so that a first power amplification branch can be formed. When at least one of power amplifiers $PA_1$ and $PA_2$ is turned on, the first power amplification branch is activated. Similarly, two ends of primary coil 212-2 are coupled to output ports of power amplifiers $PA_3$ and $PA_4$ of power amplification circuit 206-2 through coupling capacitors CS3 and CS4, respectively, so that a second power amplification branch can be formed. When at least one of power amplifiers $PA_3$ and $PA_4$ is turned on, the second power amplification branch is activated. Secondary coil 214 may be coupled to primary coils 212-1 and 212-2, and may provide the output power of transformer network 210. For example, transformer network 210 can be a parallel combining transformer including primary coils 212-1 and 212-2 and secondary coil 214, where secondary coil 214 is coupled in parallel with primary coils 212-1 and 212-2.

With reference to FIG. 4, an exemplary circuit implementation of each power amplifier $PA_i$ (i=1, 2, 3, or 4) is disclosed herein. It is contemplated that power amplifier $PA_i$ can be implemented using other circuitry structures rather than that shown in FIG. 4, which is not limited herein. In FIG. 4, each power amplifier $PA_i$ (e.g., $PA_1$, $PA_2$, $PA_3$, or $PA_4$) may include an NMOS transistor N-i (e.g., N-1, N-2, N-3, or N-4) and a PMOS transistor P-i (e.g., P-1, P-2, P-3, or P-4). A gate of the NMOS transistor N-i can be coupled to an output of a corresponding driving amplifier $DA_i$ through a first direct current (DC) blocking capacitor CN-i, so that an input signal VinN-i (e.g., VinN-1, VinN-2, VinN-3, or VinN-4) from driving amplifier $DA_i$ can be inputted to the gate of the NMOS transistor N-i. A source of the NMOS transistor N-i is coupled to the ground, and a drain of the NMOS transistor N-i is coupled to an output port of power amplifier $PA_i$.

A gate of the PMOS transistor P-i is coupled to the output of the corresponding driving amplifier $DA_i$ through a second DC blocking capacitor CP-i, so that an input signal VinP-i (e.g., VinP-1, VinP-2, VinP-3, or VinP-4) from driving amplifier $DA_i$ can be inputted to the gate of the PMOS transistor P-i. A source of the PMOS transistor P-i is coupled to a power source VDD1 or VDD2, and a drain of the PMOS transistor P-i is coupled to the output port of power amplifier $PA_i$. That is, both the drain of the NMOS transistor N-i and the drain of the PMOS transistor P-i are coupled to the output port of power amplifier $PA_i$.

By performing operations like those described above with reference to FIG. 2, control unit 105 may control an operation of power amplification device 400. Specifically, control unit 105 may determine a first circuit configuration for power amplification circuit 206-1 and a second circuit configuration for power amplification circuit 206-2 based on the transmit power level at least by: (a) adjusting an operation voltage of power amplifiers $PA_1$, $PA_2$, $PA_3$, and $PA_4$; (b) adjusting the turning-on or turning-off of power amplifiers $PA_1$, $PA_2$, $PA_3$, and $PA_4$; (c) adjusting the number of sub-PAs to be turned on in power amplifiers $PA_1$, $PA_2$, $PA_3$, and $PA_4$; or (d) performing any combination of (a)-(c). As a result, the output power of power amplification device 400 can match the transmit power level with high efficiency (e.g., the output power can be equal to a transmit power determined by the transmit power level with the peak efficiency).

In a first example, when the transmit power level indicates that power amplification device 400 is configured to operate at its peak transmit power level, all the driving amplifiers $DA_1$, $DA_2$, $DA_3$, and $DA_4$ and all the power amplifiers $PA_1$, $PA_2$, $PA_3$, and $PA_4$ can be turned on to operate in a normal state. A switch S1 in power supply network 218 can be opened, and a switch S2 in power supply network 218 can be closed, so that the operation voltage VDD2 (e.g., VDD1<VDD2) can be selected. In this case, a differential load impedance transformed by an antenna impedance from transformer network 210 to the output of each power amplification circuit 206-1 or 206-2 can be denoted as "Z." Equivalently, an impedance for power amplifier $PA_1$ or $PA_2$ in power amplification circuit 206-1 is Z/2, and an impedance for power amplifier $PA_3$ or $PA_4$ in power amplification circuit 206-2 is Z/2. Power amplification device 400 can provide the peak output power with peak efficiency.

In a second example, when the transmit power level indicates that power amplification device 400 is configured to operate at a transmit power level with a 6-dB backoff, driving amplifiers $DA_2$ and $DA_3$ can be turned off. Driving amplifiers $DA_1$ and $DA_4$ can be turned on. The switch S1 in power supply network 218 can be opened, and the switch S2 in power supply network 218 can be closed, so that the operation voltage VDD2 can be selected. The signal input signals VinN-2, VinP-2 to power amplifier $PA_2$ and the signal inputs VinN-3, VinP-3 to power amplifier $PA_3$ are configured to be VDD2. Power amplifiers $PA_2$ and $PA_3$ are turned off. Power amplifiers $PA_1$ and $PA_4$ are turned on. In this case, the differential load impedance transformed by the antenna impedance from transformer network 210 to the output of each power amplification circuit 206-1 or 206-2 is also Z. Since power amplifier $PA_2$ is turned off, the differential load impedance Z for power amplification circuit 206-1 falls on power amplifier $PA_1$ only. Thus, the impedance for power amplifier $PA_1$ in power amplification circuit 206-1 is Z. Similarly, since power amplifier $PA_3$ is turned off, the differential load impedance Z for power amplification circuit 206-2 falls on power amplifier $PA_4$ only. Thus, the impedance for power amplifier $PA_4$ in power amplification circuit 206-2 is also Z. As a result, the load impedance modulation is achieved. Power amplification device 400 can operate with the peak efficiency to provide an output power which is 6 dB backoff from the peak output power.

In a third example, when the transmit power level indicates that power amplification device 400 is configured to operate at a transmit power level with a 12-dB backoff, driving amplifiers $DA_2$ and $DA_3$ can be turned off. Driving amplifiers $DA_1$ and $DA_4$ can be turned on. The switch S1 in power supply network 218 can be closed, and the switch S2 in power supply network 218 can be opened, so that the operation voltage VDD1 (e.g., VDD1<VDD2) can be selected. The signal inputs VinN-2, VinP-2 to power amplifier $PA_2$ and the signal inputs VinN-3, VinP-3 to power amplifier $PA_3$ are configured to be VDD1. Power amplifiers $PA_2$ and $PA_3$ can be turned off. Power amplifiers $PA_1$ and $PA_4$ can be turned on. In this case, the differential load impedance transformed by the antenna impedance from transformer network 210 to the output of each power amplification circuit 206-1 or 206-2 is also Z. Since power amplifier $PA_2$ is turned off, the differential load impedance Z for power amplification circuit 206-1 falls on power amplifier $PA_1$ only. Thus, the impedance for power amplifier $PA_1$ in power amplification circuit 206-1 is Z. Similarly, since power amplifier $PA_3$ is turned off, the differential load impedance Z for power amplification circuit 206-2 falls on power amplifier $PA_4$ only. Thus, the impedance for power amplifier $PA_4$ in power amplification circuit 206-2 is also Z. As a result, the load impedance modulation is achieved. Compared with the second example, the operation voltage in the third example is reduced from VDD2 to VDD1. Power amplification device 102 can operate with the peak efficiency to provide an output power which is 12 dB backoff from the peak output power.

In a fourth example, when the transmit power level indicates that power amplification device 400 is configured to operate at a transmit power level with a backoff greater than 12 dB, power amplification circuits 206-1 and 206-2 can be firstly configured like that at the transmit power level with the 12-dB backoff. For example, driving amplifiers $DA_2$ and $DA_3$ can be turned off, and driving amplifiers $DA_1$, and $DA_4$ can be turned on. The operation voltage VDD1 can be selected. Power amplifiers $PA_2$ and $PA_3$ can be turned off, and power amplifiers $PA_1$ and $PA_4$ can be turned on. Subsequently, the sub-PAs in power amplifiers $PA_1$ and $PA_4$ can be adjusted, so that an output power matching the transmit power level can be provided by power amplification device 102 at the peak efficiency with a reduced operation current. The adjustment of the sub-PAs in power amplifier $PA_1$ or $PA_4$ is illustrated below with reference to FIG. 5.

It is contemplated that the circuit configurations of power amplification device 400 shown in the above first, second, third, and fourth examples are for illustration purposes only and are not intended to limit the implementation of the present disclosure. Power amplification device 400 can also be configured using other circuit configurations to improve its power efficiency at different transmit power levels, which is not limited herein.

Figure 5:
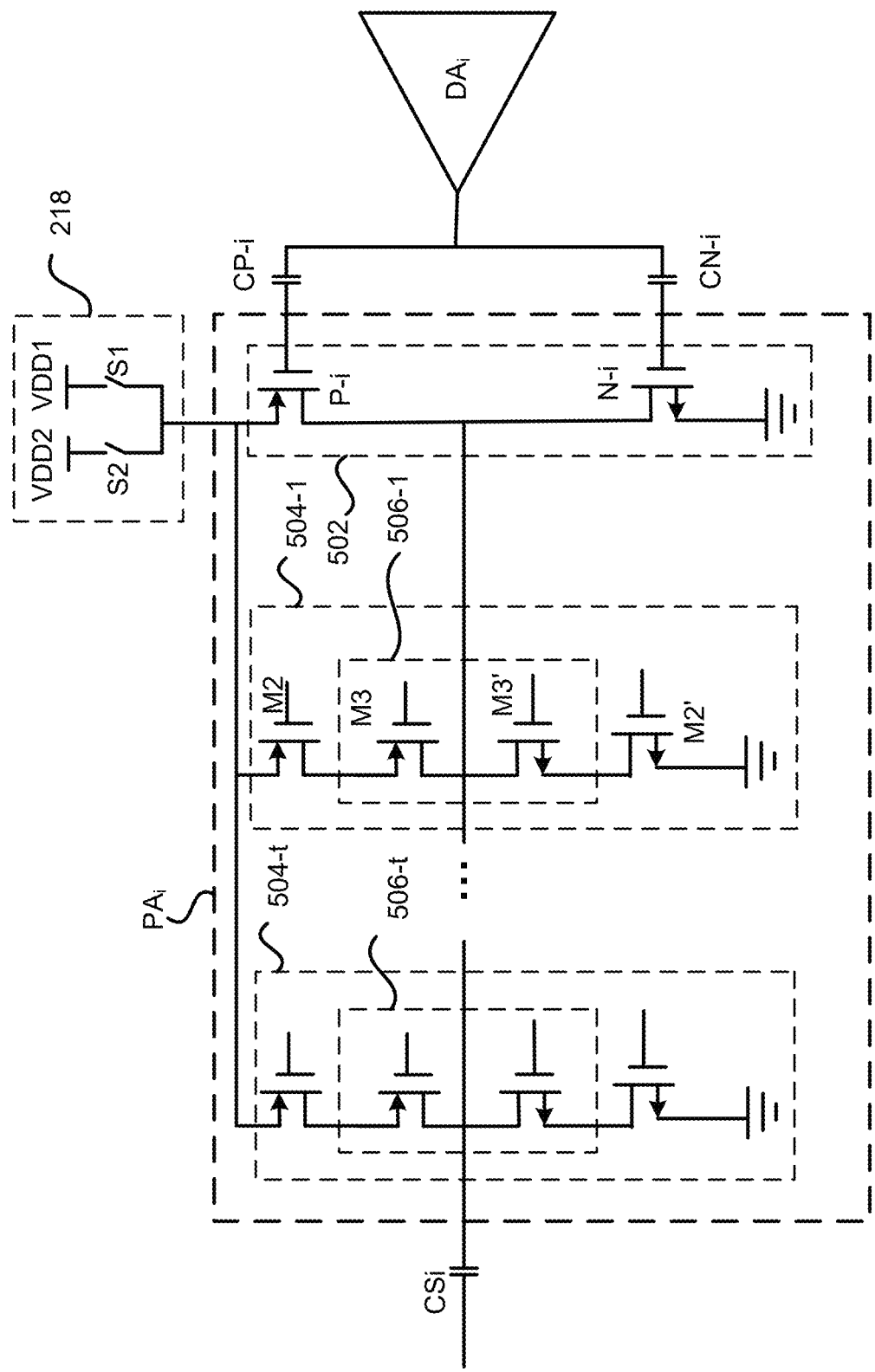
FIG. 5 illustrates an exemplary circuit implementation of a power amplifier with a plurality of sub-power amplifiers, according to some aspects of the present disclosure.

FIG. 5 illustrates an exemplary circuit implementation of a power amplifier $PA_i$ with a plurality of sub-PAs, according to some aspects of the present disclosure. The plurality of sub-PAs may include a first sub-PA 502 and one or more second sub-PAs 504-1, . . . , 504-t (also referred to as second sub-PA 504 individually or collectively), where t is a positive integer. First sub-PA 502 may include a first NMOS transistor (e.g., NMOS transistor N-i) and a first PMOS transistor (e.g., PMOS transistor P-i). A gate of the first NMOS transistor N-i is coupled to an output of a corresponding driving amplifier $DA_i$ through a first DC blocking capacitor CN-i. A source of the first NMOS transistor N-i is coupled to the ground. A drain of the first NMOS transistor N-i is coupled to an output port of the power amplifier $PA_i$, which is coupled to an end of a primary coil 212 through a coupling capacitor CSi. A gate of the first PMOS transistor P-i is coupled to the output of the corresponding driving amplifier $DA_i$ through a second DC blocking capacitor CP-i. A source of the first PMOS transistor P-i is coupled to a power source VDD1 or VDD2. A drain of the first PMOS transistor P-i is coupled to the output port of the power amplifier $PA_i$.

Each second sub-PA 504 may include a second PMOS transistor M2, a second NMOS transistor M2', and a switch 506-1, ..., 506-t (also referred to as switch 506 individually or collectively) coupled between the second PMOS transistor M2 and the second NMOS transistor M2'. A gate of the second PMOS transistor M2 is coupled to the output of the corresponding driving amplifier $DA_i$ through the first DC blocking capacitor CP-i. A source of the second PMOS transistor M2 is coupled to the power source VDD1 or VDD 2. A drain of the second PMOS transistor M2 is coupled to the output port of the power amplifier $PA_i$ through switch 506. A gate of the second NMOS transistor M2' is coupled to the output of the corresponding driving amplifier $DA_i$ through the second DC blocking capacitor [CP-i] CN-i. A source of the second NMOS transistor M2' is coupled to the ground, and a drain of the second NMOS transistor M2' is coupled to the output port of the power amplifier $PA_i$ through switch 506.

Each switch 506 may include a third PMOS transistor M3 and a third NMOS transistor M3'. A gate of the third PMOS transistor M3 is coupled to a control terminal of the third PMOS transistor M3. A source of the third PMOS transistor M3 is coupled to the drain of the second PMOS transistor M2. A drain of the third PMOS transistor M3 is coupled to the output port of the power amplifier $PA_i$. A gate of the third NMOS transistor M3' is coupled to a control terminal of the third NMOS transistor M3'. A source of the third NMOS transistor M3' is coupled to the drain of the second NMOS transistor M2'. A drain of the third NMOS transistor M3' is coupled to the output port of the power amplifier $PA_i$.

Control unit 105 may turn on (or turn off) switch 506 in a corresponding second sub-PA 504 to switch on (or off) the corresponding second sub-PA 504. For example, when the gate of the third PMOS transistor M3 is at a high voltage level and the gate of the third NMOS transistor M3' is at a low voltage level, switch 506 can be turned on. In this case, the corresponding second sub-PA 504 is turned on. When the gate of the third PMOS transistor M3 is at the low voltage level and the gate of the third NMOS transistor M3' is at the high voltage level, switch 506 can be turned off. In this case, the corresponding second sub-PA 504 is turned off. If all the second sub-PAs 504 are turned on in power amplifier $PA_i$, then power amplifier $PA_i$ can provide a large output power. If one or more of the second sub-PAs 504 are turned off in power amplifier $PA_i$, then the output power of power amplifier $PA_i$ can be reduced, and an operation current of power amplifier $PA_i$ can also be reduced to improve the power efficiency.

As shown in FIG. 5, first sub-PA 502 is separated into two segments (e.g., a first segment of the first NMOS transistor N-i and a second segment of the first PMOS transistor P-i). Each second sub-PA 504 is separated into three segments (e.g., a first segment of the second PMOS transistor M2, a second segment of switch 506, and a third segment of the second NMOS transistor M2'). It is contemplated that first sub-PA 502 can be configured with more segments (e.g., 3, 4, or more segments) and each second sub-PA 504 can be configured with more segments (e.g., 4, 5, or more segments) to achieve a finer control of the output power.

Figure 6:
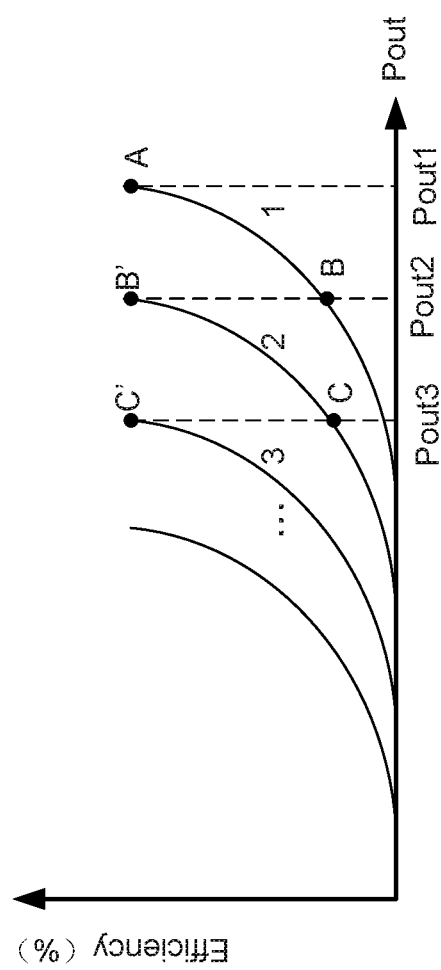
FIG. 6 illustrates exemplary efficiency curves for different transmit power levels, according to some aspects of the present disclosure.

FIG. 6 illustrates exemplary efficiency curves for a power amplification device, according to some aspects of the present disclosure. The efficiency can be described as a ratio of the output power to the DC power consumption. In FIG. 6, output powers Pout1, Pout2, and Pout3 at points A, B, and C may correspond to a first transmit power level, a second transmit power level, and a third transmit power level, respectively. For example, the output power Pout1 may be a peak output power with a peak efficiency. Curve 1, curve 2, and curve 3 may be efficiency curves when the output power of the power amplification device is implemented according to the first transmit power level, the second transmit power level, and the third transmit power level, respectively.

As shown in FIG. 6, when the output power Pout of the power amplification device is backed off from Pout1 to Pout2 in curve 1, and the output power Pout1 is still implemented according to curve 1 at point B, then the efficiency loss can be relatively large (e.g., the efficiency at point B drops by a large amount when compared with the peak efficiency at point A).

On the other hand, when the output power falls back from Pout1 to Pout2, the transmit power level is reduced from the first transmit power level to the second transmit power level. In this case, the power amplification device can be configured using one or more configuration methods disclosed above with reference to FIGS. 2-5, so that the output power Pout2 can be configured to match the second transmit power level. That is, the output power Pout2 can be implemented according to curve 2 associated with the second transmit power level (e.g., at a point B' of curve 2). As a result, the power amplification device can still have the peak efficiency at point B' of curve 2 to provide the output power Pout2 (at the second transmit power level).

Similarly, when the output power falls back from Pout2 to Pout3, the transmit power level is reduced from the second transmit power level to the third transmit power level. In this case, the power amplification device can also be configured using one or more configuration methods disclosed above with reference to FIGS. 2-5, so that the output power Pout3 can be configured to match the third transmit power level. That is, the output power Pout3 can be implemented according to curve 3 associated with the third transmit power level (e.g., at a point C' of curve 3). As a result, the power amplification device can still have the peak efficiency at point C' of curve 3 to provide the output power Pout3 (at the third transmit power level).

Figure 7:
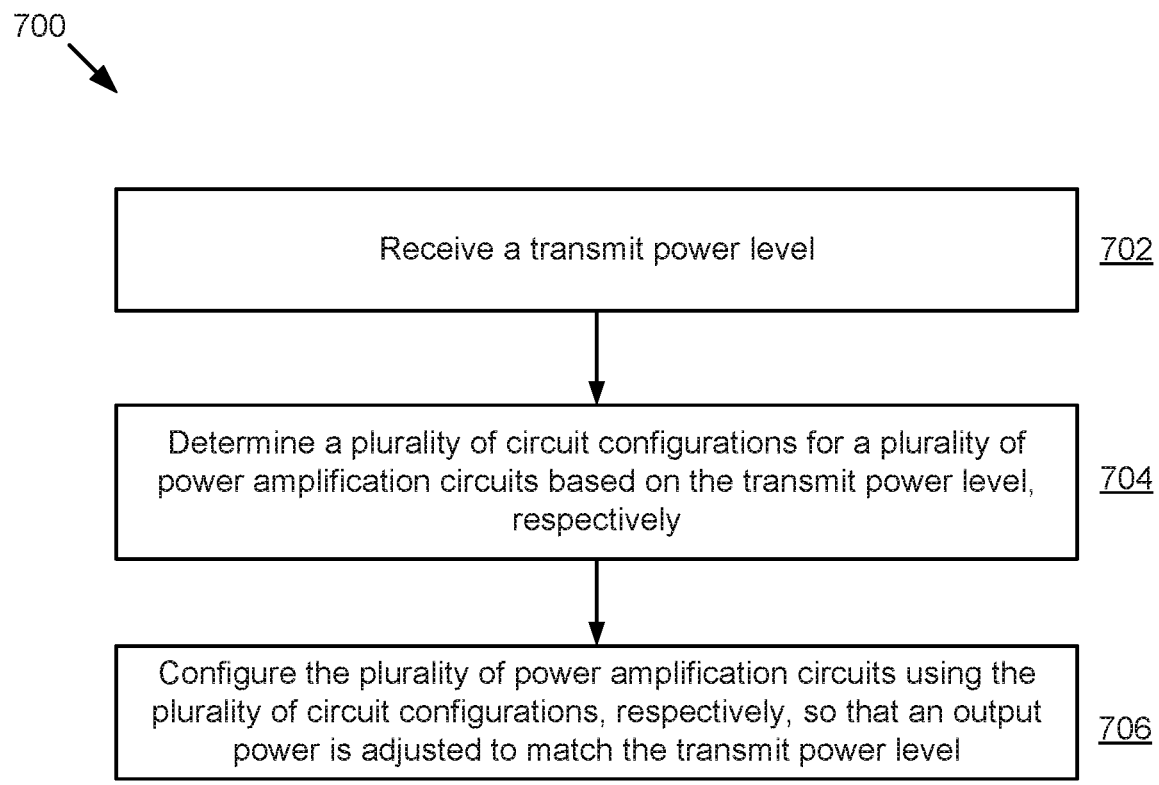
FIG. 7 illustrates a flowchart of an exemplary operation method of a power amplification device, according to some aspects of the present disclosure.

FIG. 7 illustrates a flowchart of an exemplary operation method 700 of a power amplification device (e.g., power amplification device 102 or 400), according to some aspects of the present disclosure. Method 700 may be implemented by control unit 105 (e.g., processor 106 of control unit 105). It is understood that the operations shown in method 700 may not be exhaustive and that other operations can be performed as well before, after, or between any of the illustrated operations. Further, some of the operations may be performed simultaneously, or in a different order than shown in FIG. 7.

Referring to FIG. 7, method 700 starts at operation 702, in which a transmit power level is received.

Method 700 proceeds to operation 704, as illustrated in FIG. 7, in which a plurality of circuit configurations are determined for a plurality of power amplification circuits in the power amplification device based on the transmit power level, respectively.

Method 700 proceeds to operation 706, as illustrated in FIG. 7, in which the plurality of power amplification circuits are configured using the plurality of circuit configurations, respectively, so that an output power is adjusted to match the transmit power level.

According to one aspect of the present disclosure, a power amplification device is disclosed. The power amplification device may include a plurality of power amplification circuits configured to provide a plurality of amplified outputs based on a plurality of inputs, respectively. The power amplification device may include a power supply network coupled to the plurality of power amplification circuits and configured to supply at least one of a plurality of power sources to the plurality of power amplification circuits. The power amplification device may include a transformer network coupled to the plurality of power amplification circuits and configured to provide an output power that matches a transmit power level based on the plurality of amplified outputs.

In some implementations, the power amplification device may further include a plurality of driving amplification circuits coupled to the plurality of power amplification circuits and configured to provide the plurality of inputs to drive the plurality of power amplification circuits, respectively.

In some implementations, each driving amplification circuit includes at least two driving amplifiers. Each power amplification circuit includes at least two power amplifiers (PAs) coupled to the at least two driving amplifiers, respectively.

In some implementations, each PA includes an NMOS transistor and a PMOS transistor.

In some implementations, a gate of the NMOS transistor is coupled to an output of a corresponding driving amplifier through a first direct current (DC) blocking capacitor, a source of the NMOS transistor is coupled to a ground, and a drain of the NMOS transistor is coupled to an output port of the PA. A gate of the PMOS transistor is coupled to the output of the corresponding driving amplifier through a second DC blocking capacitor, a source of the PMOS transistor is coupled to a power source selected from the plurality of power sources, and a drain of the PMOS transistor is coupled to the output port of the PA.

In some implementations, each PA includes a plurality of sub-PAs coupled in parallel.

In some implementations, the plurality of sub-PAs includes a first sub-PA and at least a second sub-PA. The first sub-PA includes a first NMOS transistor and a first PMOS transistor. The second sub-PA includes a second NMOS transistor, a second PMOS transistor, and a switch coupled between the second NMOS transistor and the second PMOS transistor.

In some implementations, a gate of the first NMOS transistor is coupled to an output of a corresponding driving amplifier through a first direct current (DC) blocking capacitor, a source of the first NMOS transistor is coupled to a ground, and a drain of the first NMOS transistor is coupled to an output port of the PA. A gate of the first PMOS transistor is coupled to the output of the corresponding driving amplifier through a second DC blocking capacitor, a source of the first PMOS transistor is coupled to a power source selected from the plurality of power sources, and a drain of the first PMOS transistor is coupled to the output port of the PA.

In some implementations, a gate of the second NMOS transistor is coupled to the output of the corresponding driving amplifier through the first DC blocking capacitor, a source of the second NMOS transistor is coupled to the ground, and a drain of the second NMOS transistor is coupled to the output port of the PA through the switch. A gate of the second PMOS transistor is coupled to the output of the corresponding driving amplifier through the second DC blocking capacitor, a source of the second PMOS transistor is coupled to the power source selected from the plurality of power sources, and a drain of the second PMOS transistor is coupled to the output port of the PA through the switch.

In some implementations, the transformer network includes a plurality of primary coils coupled to the plurality of power amplification circuits, respectively. The transformer network includes a secondary coil coupled to the plurality of primary coils and configured to provide the output power through the coupling of the plurality of primary coils. The transformer network further includes a load matching capacitor coupled to the secondary coil.

In some implementations, two ends of each primary coil are coupled to output ports of the at least two PAs in a corresponding power amplification circuit through corresponding coupling capacitors, respectively. A first end of the secondary coil is coupled to a ground, and a second end of the secondary coil is coupled to an output port of the power amplification device. Two ends of the load matching capacitor are coupled to the first and second ends of the secondary coil, respectively.

In some implementations, the plurality of power sources include a first power source corresponding to a peak output power and one or more second power sources corresponding to one or more output powers smaller than the peak output power.

According to another aspect of the present disclosure, a power amplification system is disclosed. The power amplification system includes a power amplification device and a control unit. The power amplification device includes a plurality of power amplification circuits configured to provide a plurality of amplified outputs based on a plurality of inputs, respectively. The power amplification device includes a power supply network coupled to the plurality of power amplification circuits and configured to supply at least one power source from a plurality of power sources to the plurality of power amplification circuits. The power amplification device includes a transformer network coupled to the plurality of power amplification circuits and configured to provide an output power that matches a transmit power level based on the plurality of amplified outputs. The control unit is coupled to the power amplification device, and includes a memory storing code and a processor coupled to the memory. When the code is executed, the processor is configured to determine a plurality of circuit configurations for the plurality of power amplification circuits based on the transmit power level, respectively. The processor is further configured to configure the plurality of power amplification circuits using the plurality of circuit configurations, respectively, so that the output power matches the transmit power level.

In some implementations, to determine the plurality of circuit configurations for the plurality of power amplification circuits based on the transmit power level, respectively, the processor is further configured to select the at least one power source from the plurality of power sources based on the transmit power level.

In some implementations, each power amplification circuit includes a plurality of power amplifiers (PAs). To determine the plurality of circuit configurations for the plurality of power amplification circuits based on the transmit power level, respectively, the processor is configured to, for each power amplification circuit, select one or more PAs to be turned on from the plurality of PAs based on the transmit power level.

In some implementations, to determine the plurality of circuit configurations for the plurality of power amplification circuits based on the transmit power level, respectively, the processor is further configured to, for each PA to be turned on, select the at least one power source from the plurality of power sources based on the transmit power level.

In some implementations, each PA includes a plurality of sub-PAs. To determine the plurality of circuit configurations for the plurality of power amplification circuits based on the transmit power level, respectively, the processor is further configured to, for each PA to be turned on, select one or more sub-PAs to be turned on from the plurality of sub-PAs based on the transmit power level.

In some implementations, the power amplification device further includes a plurality of driving amplification circuits coupled to the plurality of power amplification circuits and configured to provide the plurality of inputs to drive the plurality of power amplification circuits, respectively. Each driving amplification circuit includes a plurality of driving amplifiers corresponding to a plurality of power amplifiers (PAs) in a corresponding power amplification circuit. The processor is further configured to determine, from the plurality of driving amplifiers, one or more driving amplifiers to be turned on based on one or more PAs being turned on within the plurality of PAs.

According to yet another aspect of the present disclosure, an operation method of a power amplification device is disclosed. A transmit power level is received. A plurality of circuit configurations are determined for a plurality of power amplification circuits in the power amplification device based on the transmit power level, respectively. The plurality of power amplification circuits are configured using the plurality of circuit configurations, respectively, so that an output power of the power amplification device matches the transmit power level.

In some implementations, each power amplification circuit includes a plurality of power amplifiers (PAs). Determining the plurality of circuit configurations for the plurality of power amplification circuits based on the transmit power level, respectively, includes at least one of the following: for each power amplification circuit, selecting one or more PAs to be turned on from the plurality of PAs based on the transmit power level; for each PA, selecting a power source from a plurality of power sources based on the transmit power level; or for each PA, selecting one or more sub-PAs to be turned on from a plurality of sub-PAs in the PA based on the transmit power level.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A power amplification device, comprising:
a plurality of power amplification circuits configured to provide a plurality of amplified outputs based on a plurality of inputs, respectively;
a power supply network coupled to the plurality of power amplification circuits, and configured to supply at least one of a plurality of power sources to the plurality of power amplification circuits; and
a transformer network coupled to the plurality of power amplification circuits, and configured to provide an output power that matches a transmit power level based on the plurality of amplified outputs,
wherein each power amplification circuit comprises at least two power amplifiers (PAs), and each PA comprises a plurality of sub-PAs having respective outputs coupled to an output port of the PA in parallel,
wherein the plurality of sub-PAs comprises a first sub-PA and at least a second sub-PA,
wherein the first sub-PA comprises a first NMOS transistor and a first PMOS transistor, and
wherein the second sub-PA comprises a second NMOS transistor, a second PMOS transistor, and a switch coupled between the second NMOS transistor and the second PMOS transistor.

2. The power amplification device of claim 1, further comprising:
a plurality of driving amplification circuits coupled to the plurality of power amplification circuits, and configured to provide the plurality of inputs to drive the plurality of power amplification circuits, respectively.

3. The power amplification device of claim 1, wherein:
each driving amplification circuit comprises at least two driving amplifiers and corresponds to a respective one of the power amplification circuits; and
at least two PAs of the respective one of the power amplification circuits are coupled to the at least two driving amplifiers, respectively.

4. An operation method of a power amplification device, comprising:
receiving a transmit power level;
determining a plurality of circuit configurations for a plurality of power amplification circuits in the power amplification device based on the transmit power level, respectively, wherein when the transmit power level is changed, the plurality of circuit configurations for the plurality of power amplification circuits are also changed such that an output power of the power amplification device matches the transmit power level; and
configuring the plurality of power amplification circuits using the plurality of circuit configurations, respectively,
wherein the power amplification device comprises:
the plurality of power amplification circuits configured to provide a plurality of amplified outputs based on a plurality of inputs, respectively;
a power supply network coupled to the plurality of power amplification circuits, and configured to supply at least one of a plurality of power sources to the plurality of power amplification circuits; and
a transformer network coupled to the plurality of power amplification circuits, and configured to provide the output power that matches the transmit power level based on the plurality of amplified outputs,
wherein each power amplification circuit comprises a plurality of power amplifiers (PAS), and each PA comprises a plurality of sub-PAs having respective outputs coupled to an output port of the PA in parallel,
wherein the plurality of sub-PAs comprises a first sub-PA and at least a second sub-PA, wherein the first sub-PA comprises a first NMOS transistor and a first PMOS transistor, and
wherein the second sub-PA comprises a second NMOS transistor, a second PMOS transistor, and a switch coupled between the second NMOS transistor and the second PMOS transistor.

5. The operation method of claim 4, wherein determining the plurality of circuit configurations for the plurality of power amplification circuits based on the transmit power level, respectively, comprises at least one of the following:
for each power amplification circuit, selecting one or more PAs to be turned on from the plurality of PAs based on the transmit power level;
for each PA, selecting a power source from the plurality of power sources based on the transmit power level; or
for each PA, selecting one or more sub-PAs to be turned on from the plurality of sub-PAs in the PA based on the transmit power level.

6. A power amplification system, comprising:
a power amplification device, comprising:
a plurality of power amplification circuits configured to provide a plurality of amplified outputs based on a plurality of inputs, respectively;
a power supply network coupled to the plurality of power amplification circuits, and configured to supply at least one power source from a plurality of power sources to the plurality of power amplification circuits; and
a transformer network coupled to the plurality of power amplification circuits, and configured to provide an output power that matches a transmit power level based on the plurality of amplified outputs,
wherein each power amplification circuit comprises a plurality of power amplifiers (PAS), and each PA comprises a plurality of sub-PAs having respective outputs coupled to an output port of the PA in parallel,
wherein the plurality of sub-PAs comprises a first sub-PA and at least a second sub-PA,
wherein the first sub-PA comprises a first NMOS transistor and a first PMOS transistor, and
wherein the second sub-PA comprises a second NMOS transistor, a second PMOS transistor, and a switch coupled between the second NMOS transistor and the second PMOS transistor; and
a control unit coupled to the power amplification device, and comprising a memory storing code and a processor coupled to the memory, wherein when the code is executed, the processor is configured to:
determine a plurality of circuit configurations for the plurality of power amplification circuits based on the transmit power level, respectively, wherein when the transmit power level is changed, the plurality of circuit configurations for the plurality of power amplification circuits are also changed such that the output power provided by the transformer network matches the transmit power level; and
configure the plurality of power amplification circuits using the plurality of circuit configurations, respectively.

7. The power amplification system of claim 6, wherein to determine the plurality of circuit configurations for the plurality of power amplification circuits based on the transmit power level, respectively, the processor is configured to:
for each power amplification circuit, select one or more PAs to be turned on from the plurality of PAs based on the transmit power level.

8. The power amplification device of claim 1, wherein:
a gate of the first NMOS transistor is coupled to an output of a corresponding driving amplifier through a first direct current (DC) blocking capacitor, a source of the first NMOS transistor is coupled to a ground, and a drain of the first NMOS transistor is coupled to the output port of the PA; and
a gate of the first PMOS transistor is coupled to the output of the corresponding driving amplifier through a second DC blocking capacitor, a source of the first PMOS transistor is coupled to a power source selected from the plurality of power sources, and a drain of the first PMOS transistor is coupled to the output port of the PA.

9. The power amplification device of claim 8, wherein:
a gate of the second NMOS transistor is coupled to the output of the corresponding driving amplifier through the first DC blocking capacitor, a source of the second NMOS transistor is coupled to the ground, and a drain of the second NMOS transistor is coupled to the output port of the PA through the switch; and
a gate of the second PMOS transistor is coupled to the output of the corresponding driving amplifier through the second DC blocking capacitor, a source of the second PMOS transistor is coupled to the power source selected from the plurality of power sources, and a drain of the second PMOS transistor is coupled to the output port of the PA through the switch.

10. The power amplification device of claim 3, wherein the transformer network comprises:
a plurality of primary coils coupled to the plurality of power amplification circuits, respectively;
a secondary coil coupled to the plurality of primary coils and configured to provide the output power through the coupling of the plurality of primary coils; and
a load matching capacitor coupled to the secondary coil.

11. The power amplification device of claim 10, wherein:
two ends of each primary coil are coupled to output ports of the at least two PAs in a corresponding power amplification circuit through corresponding coupling capacitors, respectively;
a first end of the secondary coil is coupled to a ground, and a second end of the secondary coil is coupled to the output port of the power amplification device; and
two ends of the load matching capacitor are coupled to the first and second ends of the secondary coil, respectively.

12. The power amplification device of claim 1, wherein the plurality of power sources comprise a first power source corresponding to a peak output power and one or more second power sources corresponding to one or more output powers smaller than the peak output power.

13. The power amplification system of claim 6, wherein the power amplification device further comprises:
a plurality of driving amplification circuits coupled to the plurality of power amplification circuits, and configured to provide the plurality of inputs to drive the plurality of power amplification circuits, respectively;
each driving amplification circuit comprises a plurality of driving amplifiers corresponding to a plurality of power amplifiers (PAs) in a corresponding power amplification circuit; and
the processor is further configured to determine, from the plurality of driving amplifiers, one or more driving amplifiers to be turned on based on one or more PAs being turned on within the plurality of PAs.

14. The power amplification system of claim 6, wherein to determine the plurality of circuit configurations for the plurality of power amplification circuits based on the transmit power level, respectively, the processor is further configured to:
  select the at least one power source from the plurality of power sources based on the transmit power level.

15. The power amplification system of claim 7, wherein to determine the plurality of circuit configurations for the plurality of power amplification circuits based on the transmit power level, respectively, the processor is further configured to:
  for each PA to be turned on, select one or more sub-PAs to be turned on from the plurality of sub-PAs based on the transmit power level.

16. The power amplification system of claim 7, wherein to determine the plurality of circuit configurations for the plurality of power amplification circuits based on the transmit power level, respectively, the processor is further configured to:
  for each PA to be turned on, select the at least one power source from the plurality of power sources based on the transmit power level.

17. The power amplification system of claim 6,
  wherein to determine the plurality of circuit configurations for the plurality of power amplification circuits based on the transmit power level, respectively, the processor is configured to:
    for each power amplification circuit, select one or more PAs to be turned on from the plurality of PAs based on the transmit power level; and
    for each PA to be turned on, select one or more sub-PAs to be turned on from the plurality of sub-PAs based on the transmit power level.

* * * * *